United States Patent
Chen et al.

(10) Patent No.: US 7,795,939 B2
(45) Date of Patent: Sep. 14, 2010

(54) METHOD AND SYSTEM FOR SETUP/HOLD CHARACTERIZATION IN SEQUENTIAL CELLS

(75) Inventors: Ker-Min Chen, Hsin-Chu (TW); Ching-Hao Shaw, San Jose, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 88 days.

(21) Appl. No.: 12/344,810

(22) Filed: Dec. 29, 2008

(65) Prior Publication Data

US 2010/0164583 A1 Jul. 1, 2010

(51) Int. Cl.
*H03K 3/00* (2006.01)
(52) U.S. Cl. .............. 327/199; 716/6; 324/763; 324/765
(58) Field of Classification Search ......... 327/199–201, 327/215, 218, 219, 225; 716/6; 324/763, 324/765; 368/120; 714/731

See application file for complete search history.

(56) References Cited

OTHER PUBLICATIONS

Dudek, P., et al.; "A High-Resolution CMOS Time-to-Digital Converter Utilizing a Vernier Delay Line", IEEE Transactions on Solid-State Circuits, vol. 35, No. 2, Feb. 2000, pp. 240-247.
Chen, P., et al.; "A PVT Insensitive Vernier-Based Time-to-Digital Converter With Extended Input Range and High Acccuracy", IEEE Transactions on Nuclear Science, vol. 54, No. 2, Apr. 2007, pp. 294-302.

*Primary Examiner*—Long Nguyen
*Assistant Examiner*—Sibin Chen
(74) *Attorney, Agent, or Firm*—Slater & Matsil, L.L.P.

(57) ABSTRACT

An on-chip logic cell timing characterization circuit is provided. Also provided are a method of conducting setup/hold characterization on a sequential cell and a method of characterizing propagation delay on a logic cell. A sequential cell on which setup/hold time is to be characterized is formed in duplicate with one close to the other. A first clock signal is sampled at a transition of a second clock signal on one sequential cell, and a setup time is determined by a state transition in the output signal of the first sequential. The second clock signal is sampled at a transition of the first clock signal on the other sequential cell, and a hold time is determined by a state transition in the output signal of the second sequential cell.

20 Claims, 10 Drawing Sheets

METHOD AND SYSTEM FOR SETUP/HOLD CHARACTERIZATION IN SEQUENTIAL CELLS

TECHNICAL FIELD

The present invention relates generally to integrated circuits and, more particularly, to methods and systems for setup/hold time characterization in sequential cells in an integrated circuit.

BACKGROUND

In designing an advanced digital integrated circuit (IC), designers typically rely upon electronic design automation (EDA) software to help create a circuit schematic design consisting of millions or tens of millions of individual devices that are coupled together to perform highly complex circuit functions. Such devices include, among other things, basic logical units that perform basic logical functions. These basic logical units can be combinational cells, such as logic gates, adders and sequential cells, such as flip-flops, latches, and memories. The information of these basic logical units is typically stored in a standard cell library, which may include thousands of basic logical units usable in implementing an advanced IC design. These basic logical units are also generally referred to as design library cells.

Typical library cell information includes cell propagation delay, cell pin capacitance, cell output slew, etc. For sequential cells, such as registers and latches, library cell information also includes setup and hold time requirements. Timing information such as cell propagation delay and setup/hold time requirements are typically stored in cell timing libraries. The accuracy of the data in cell timing libraries is an important factor in determining the overall timing performance at which a particular circuit design can operate. As an example, the setup and hold time requirements of sequential cells are used to verify the timing of a synchronous circuit design. If characterization of the timing constraints is inaccurate, the results can be either highly optimistic or pessimistic. The optimistic case can cause a fabricated circuit to fail whereas the pessimistic case can unnecessarily degrade circuit performance, making it more difficult to achieve a target frequency.

Figure 1:
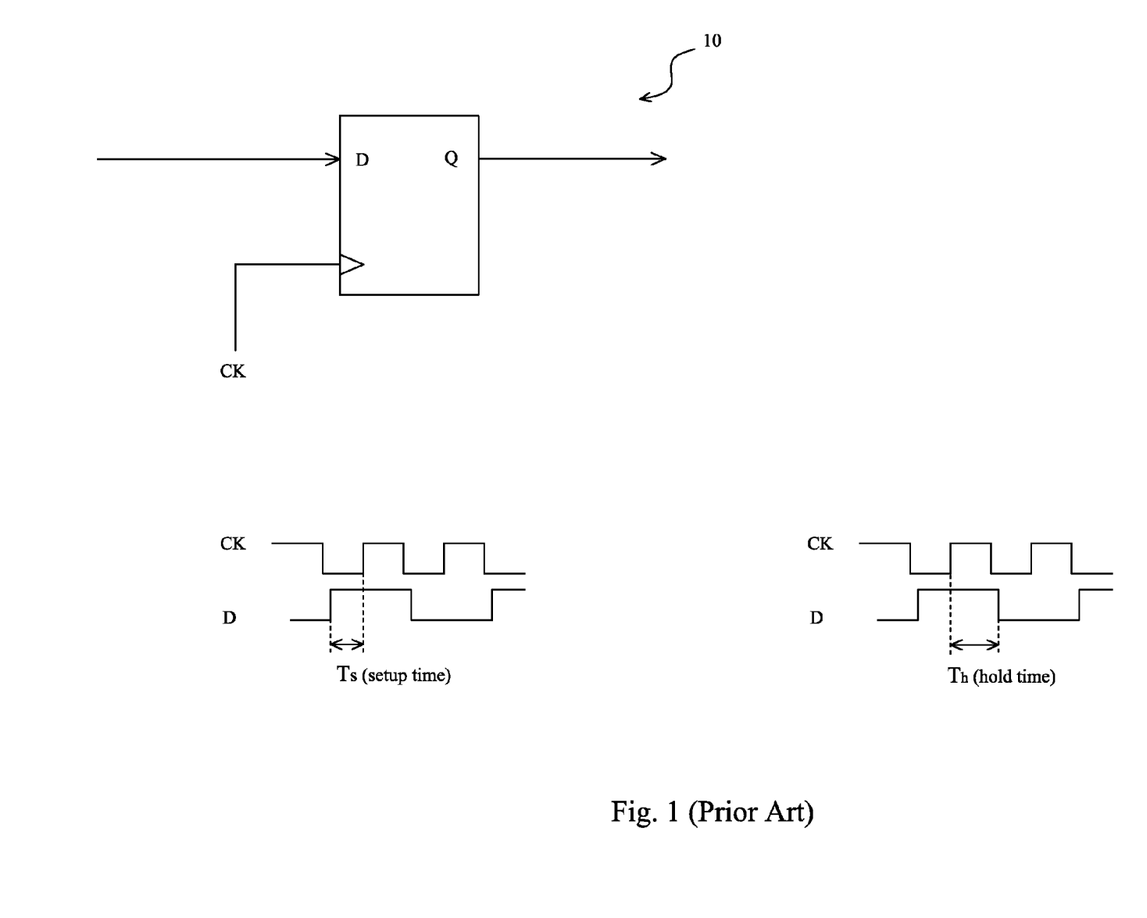
FIG. 1 illustrates a setup/hold time requirements on an exiting D flip-flop.

FIG. 1 illustrates a simplified D flip-flop 10 for purposes of describing setup/hold time requirements and propagation delay (also sometimes referred to as cell timing arc). Simplified D flip-flop 10 comprises a data input terminal D, a clock input terminal CK, and an output terminal Q. The setup time requirement (Ts) is the minimum time period required for data to be valid (i.e., stable) on a data input pin D before a clock sampling edge of the clock signal CK arrives. The reason for this requirement is that a signal has a propagation speed that is dependent on the medium in which it travels. Specifically for a D flip-flop, the requirement is needed due to the time necessary to charge stray capacitance at the input pin of a D flip-flop, hence requiring the data bit to be at the data input pin D before the clock edge arrives.

Hold time (Th) can be thought of as the inverse of the setup time with respect to the reference clock edge. The hold time requirement is the minimum time period required for the data to be valid (i.e., stable) on a data input pin D before a reference clock edge in order to ensure that the input data captured on the reference edge does not change. The requirement is necessary to ensure that the data bit D is held constant long enough for the internal transistors for active devices to switch states.

Propagation delay (Tpd) occurs as a combination of active devices that can not switch states immediately and the delay in time of an input signal through its input path to its output path. Switching time is the typical cause of propagation delay. Propagation delay is generally represented by the amount of time it takes for the output of a logical cell (combinational or sequential) to change state after the input changes.

A common approach to characterizing setup/hold time for a sequence cell is typically performed on a plurality of sequence cells because the setup/hold time on a single sequence cell is typically very small and setup/hold time characterization precision on a single sequence cell is limited by the measurement error of an existing characterization setup. In order to detect the signal edges and check the delayed signal edge alignment, complex analog characterization circuit is typically employed, which requires increased IC substrate areas. As another problem of an existing characterization setup, the characterization precision is limited by the variation between the process, operating voltage and operating temperature on the plurality of sequence cells under characterization. These and other problems in an existing characterization setup limit the characterization precision above the tens of picoseconds range.

SUMMARY OF THE INVENTION

These and other problems are generally solved or circumvented, and technical advantages are generally achieved, by preferred embodiments of the present invention which provide a method of conducting setup/hold characterization on a sequential cell and a method of characterizing propagation delay on a logic cell.

In accordance with a preferred embodiment of the present invention, a method of setup and hold characterization in an integrated circuit cell comprises the steps of generating a first and a second periodic signal, the first periodic signal having a frequency greater than the frequency of the second periodic signal. The method also comprises coupling the first periodic signal to a clock pin of a first sequential cell and coupling the second periodic signal to a data input pin of the first sequential cell, thereby causing the second periodic signal to be sampled at a transition of the first periodic signal on the first sequential cell. The method further comprises coupling the first periodic signal to a data input pin of a second sequential cell and coupling the second periodic signal to a clock pin of the second sequential cell, thereby causing the first periodic signal to be sampled at a transition of the second periodic signal on the second sequential cell, wherein the second sequential cell is substantially identical with the first sequential cell. The method further comprises determining a first setup time from a first state transition in an output signal of the first sequential cell and determining a first hold time from a first state transition in an output signal of the second sequential cell.

In accordance with another preferred embodiment of the present invention, a method for integrated circuit cell characterization comprises providing first and second sequential cells with cross-connected inputs, the first and the second sequential cells being substantially identical, wherein a clock input of the first sequential cell is coupled to the data input of the second sequential cell, thereby forming a first node. A clock input of the second sequential cell is coupled to the data input of the first sequential cell, thereby forming a second node. The method also comprises providing a first periodic signal to the first node and providing a second periodic signal to the second node, wherein the first and the second periodic signal are simultaneously launched by a trigger signal. The method further comprises detecting a first state transition in an output signal of the first sequential cell, fetching a first number of elapsed cycles of the first periodic signal until the first state transition in the first sequential cell, detecting a second state transition in an output signal of the second sequential cell, and fetching a second number of elapsed cycles of the second periodic signal until the second state transition in the second sequential cell.

In accordance with yet another preferred embodiment of the present invention, a system for integrated circuit cell timing characterization circuit comprises a first circuit for generating a first clock signal, and a second circuit for generating a second clock signal, the frequency of the second clock signal being greater than the frequency of the first clock signal. The system also comprises a trigger circuit for simultaneously launching the first and the second clock signal, a preset circuit for adjusting the phase between the first and the second clock signal. The system further comprises a first sequential cell, wherein the first clock signal is sampled at a transition of the second clock signal, and a second sequential cell, wherein the second clock signal is sampled at a transition of the first clock signal. The system further comprises a first fetch unit for detecting a first state transition in an output signal of the first sequential cell, and a first counter for counting a first number of the elapsed cycles of the second clock signal until the first state transition in an output signal of the first sequential cell. The system additionally comprises a second fetch unit for detecting a second state transition in an output signal of the second sequential cell and a second counter for counting a second number of the elapsed cycles of the first clock signal until the second state transition in an output signal of the second sequential cell.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely methods and systems for setup/hold time characterization in sequential cells in an integrated circuit. Embodiments of the present invention may provide sequential cell setup/hold time characterization with improved accuracy. The preferred embodiments may also be employed to characterize propagation delay on a library cell, e.g., a combinational cell or a sequential cell, with improved accuracy. In contrast with a conventional library cell characterization method, the characterization system in preferred embodiments is significantly simplified, requiring much less chip area. Moreover, the characterization system in preferred embodiments provides characterization results that are fully digitized, thus leading to improved characterization precision and efficiency.

Figure 2:
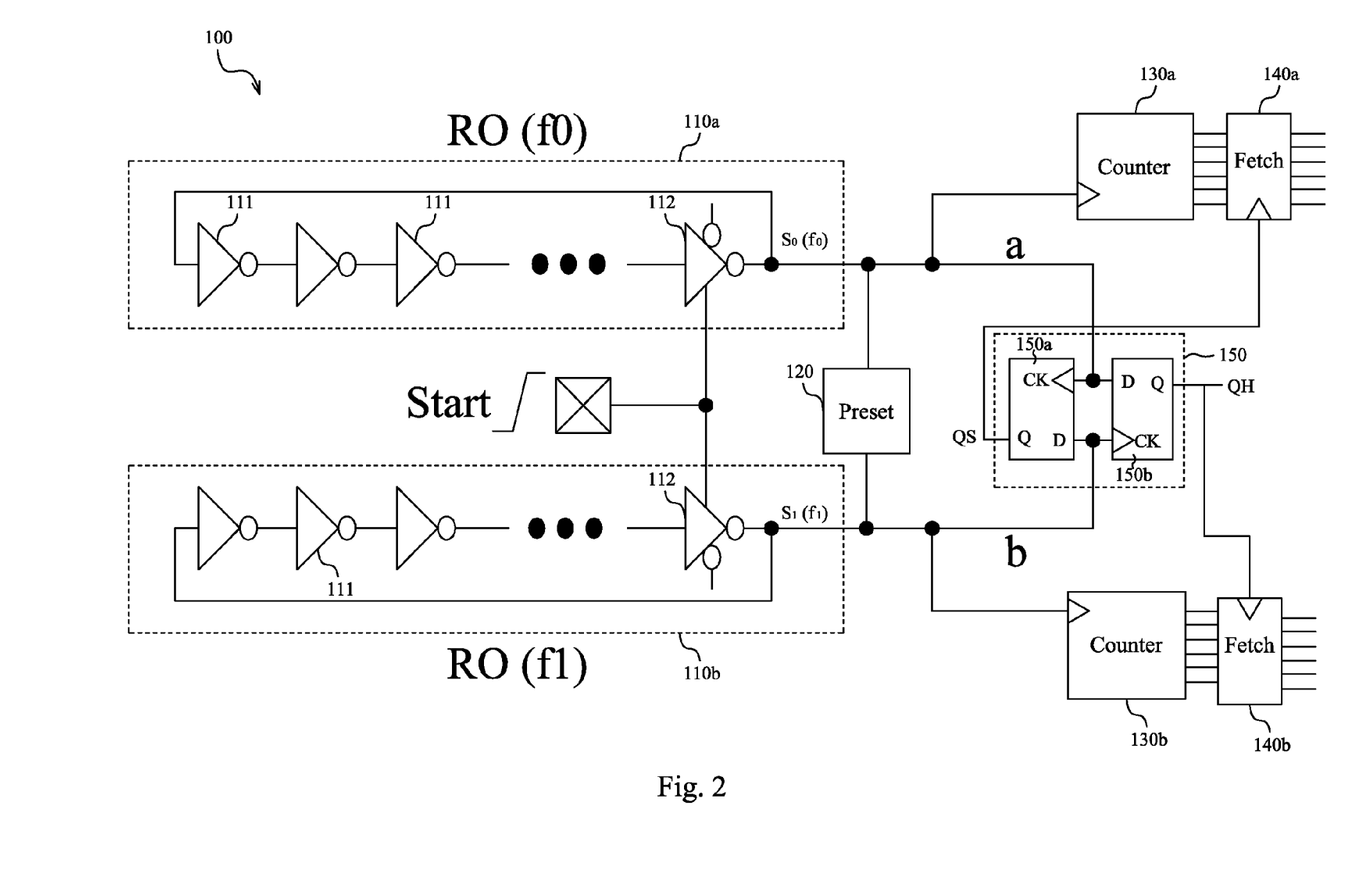
FIG. 2 illustrates a block diagram of sequential cell setup/hold time characterization circuit of an illustrative embodiment.

FIG. 2 illustrates a block diagram of a sequential cell setup/hold time characterization circuit 100 according to a preferred embodiment of the current invention. Characterization circuit 100 comprises a first ring oscillator 110a and a second ring oscillator 110b. The first and the second ring oscillators 110a and 110b have a matching configuration, each of which generally comprises an odd number (e.g., five) of inverters 111 connected in a circular chain. In an embodiment, ring oscillators 110a and 110b have substantially identical circuit layout and are formed close to each other with, for example, a 65 nm complementary-metal-oxide-semiconductor (CMOS) technology on a silicon substrate. In other embodiments, ring oscillators 110a and 110b with other circuit configurations may be also used, and may be formed with advanced processing technologies, such as a 45 nm or 32 nm CMOS processing technology.

In operation, ring oscillators 110a and 110b oscillate and output a first periodic clock signal $S_0$ with oscillation frequency $f_0$ (also referred to as first clock signal $S_0$) and a second periodic clock signal $S_1$ with oscillation frequency $f_1$ (also referred to as second clock signal $S_1$) to output terminals "a" and "b," respectively. Furthermore, trigger signal "Start" is coupled to an output stage of ring oscillators 110a and an output stage of ring oscillators 110b so that the first clock signal $S_0$ from ring oscillators 110a and the second clock signal $S_1$ from ring oscillators 110b can be launched simultaneously. In FIG. 2, trigger signal "Start" is coupled to tri-state buffers 112 that are enabled through a low-to-high transition of trigger signal "Start."

In preferred embodiments, the frequency $f_0$ of the first clock signal $S_0$ and the frequency $f_1$ of the second clock signal $S_1$ are slightly different, but very close to each other. As an example, in a cell setup/hold time characterization circuit 100 formed with advanced processing technology, the difference between the period ($T_0$) of clock signal $S_0$ and the period ($T_1$) of clock signal $S_1$ is very small and $\Delta T$ ($\Delta T=|T_0-T_1|$) is preferably less than 5 picoseconds (ps). In one embodiment, the frequency difference is spontaneous because the oscillation frequencies $f_0$ and $f_1$ (thus period $T_0$ and $T_1$) of ring oscillators 110a and 110b are very sensitive to process, operating voltage and operating temperature variation. Although careful layout efforts may be employed to reduce the mismatch between the process, operating voltage and operating temperature variations (also sometimes referred to as PVT variations) in ring oscillators 110a and 110b, the mismatch may not be eliminated completely, thus causing slight discrepancy between $f_0$ and $f_1$. In another embodiment, a pre-determined difference between $f_0$ and $f_1$ is desired; ring oscillators 110a and 110b are thus implemented through calculated mismatch between the layout, operating voltage, and other effective parameters. In an alternative and/or additional embodiment, additional circuit control mechanism may be implemented with ring oscillators 110a and 110b so that the frequency $f_0$ of the first clock signal $S_0$ and the frequency $f_1$ of the second clock signal $S_1$ may be independently adjusted.

Preset circuit unit 120 is coupled between the first ring oscillator 110a and the second oscillator 110b. In an embodiment, preset circuit unit 120 comprises a tunable phase-shifting circuit, which enables phase shifting of one or both of the clock signals $S_0$ and $S_1$ so that a pre-determined phase difference between signals $S_0$ and $S_1$ may be obtained. As an example, by adjusting preset circuit unit 120, clock signals $S_0$ and $S_1$ may be set to be in-phase (i.e., phase difference is 0 radians), in anti-phase (i.e., phase difference is 180 radians), or in other preset phase difference. In other words, clock signals $S_0$ and $S_1$ may be launched simultaneously with synchronized rising edges or synchronized falling edges. Clock signals $S_0$ and $S_1$ may also be simultaneously launched with a rising edge on one of the signals $S_0$ and $S_1$, and a falling edge on the other signal. Digital counters 130a and 130b are formed and coupled to the output terminals of ring oscillators 110a and 110b. When ring oscillators 110a and 110b are triggered to launch clock signals $S_0$ and $S_1$, digital counters 130a and 130b may be used to count the integer numbers of clock pulses of clock signals $S_0$ and $S_1$ in a manner as described below in an illustrative embodiment.

Also included in characterization circuit 100 is sequential library cell 150 to be characterized (also sometimes referred to as device-under-test, or DUT). DUT 150 is coupled between the output terminals "a" and "b" of ring oscillators 110a and 110b. The setup/hold time on DUT 150 is measured, and the setup/hold characterization of a sequential library cell identical with DUT 150 may be thus obtained. In an embodiment, DUT 150 comprises a register 150a and its replica 150b, where clock signal $S_0$ is coupled to the clock pin (CK) of register 150a and the data input pin (D) of register 150b, and the clock signal $S_1$ is coupled to the clock pin (CK) of register 150b and the data input pin (D) of register 150a. The setup/hold times on registers 150a and 150b may be characterized through, among other things, detecting a signal level transition on the output pin QS of register 150a and a signal level transition on the output pin QH of register 150b. In an embodiment, the level transitions on QS and QH are detected by a first fetch unit 140a and a second fetch unit 140b, respectively. To minimize the effect of PVT variations, registers 150a and 150b are preferably laid out as close as possible to each other.

Figure 3:
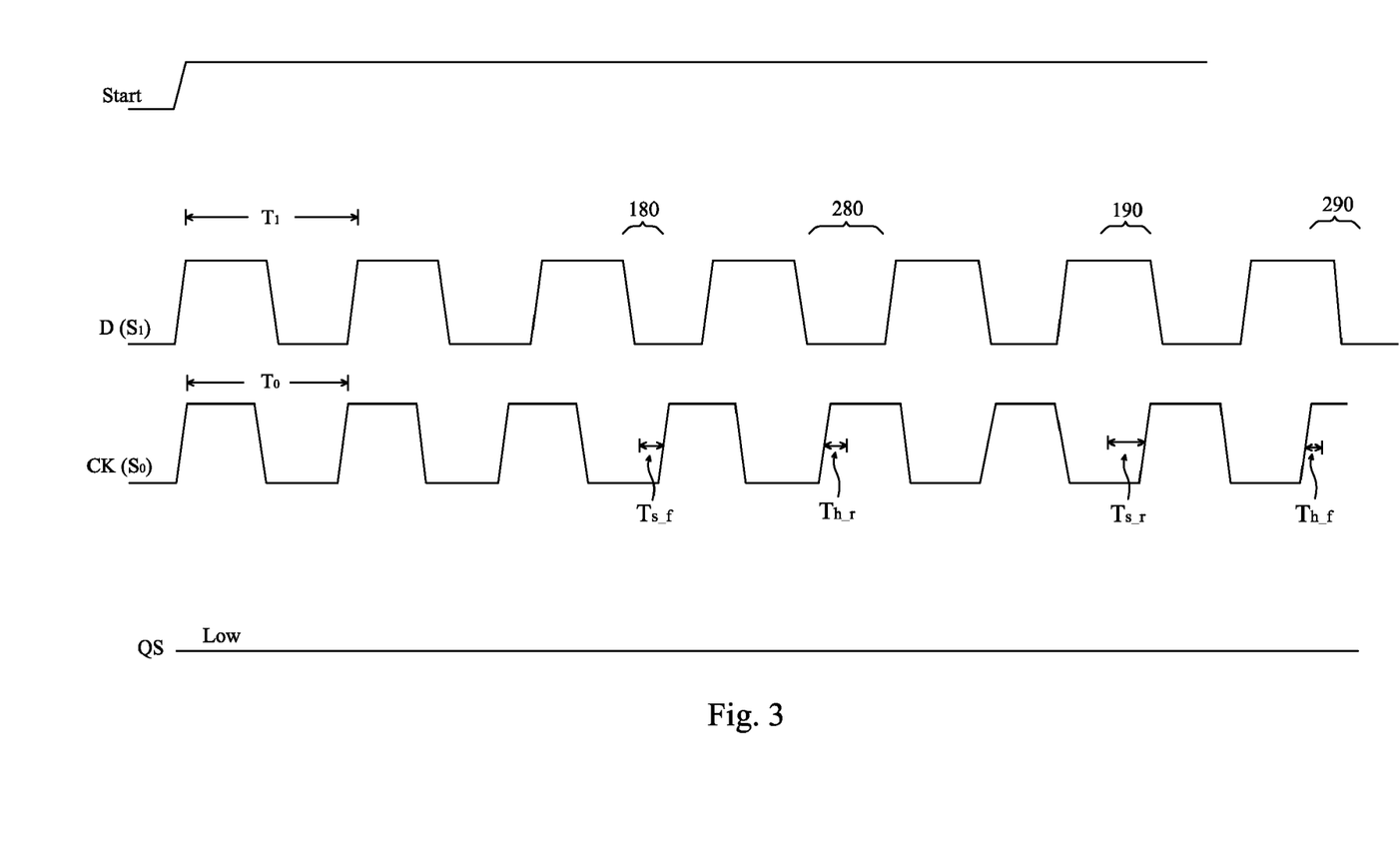
FIG. 3 illustrates a timing diagram of signals on a register of an illustrative embodiment.

FIG. 3 illustrates a timing diagram where the wave forms on the CK pin, D pin, and output pin QS of register 150a are plotted. When the trigger signal "Start" arrives (e.g., transitions from low to high), clock signals $S_0$ and $S_1$ are simultaneously launched from ring oscillators 110a and 110b with synchronized rising edges. The frequency $f_0$ of signal $S_0$ is slightly higher than the frequency $f_1$ of signal $S_1$ (i.e., $T_0$ is less than $T_1$). As described previously, signal $S_0$ is coupled to the CK pin of register 150a and is used as a clock signal of register 150a, while signal $S_1$ is coupled to the D pin of register 150a and is used as an input signal of register 150a. In the current embodiment, register 150a is positive edge-triggered. When the clock signal CK ($S_0$) toggles, the state of data signal D ($S_1$) is sampled into register 150a at each rising edge of the clock signal CK ($S_0$) and is outputted on the output pin QS.

It is noted that the state transition on the various signals is assumed to take place at the mid-point (50%) of a signal transition edge in order to simplify description. One skilled in the art will realize that the transition points may be defined at different levels of the respective state transition edges rather than the mid-points.

In order to satisfy setup requirements, data signal D is required to be valid (i.e., stable) for some period of time before a clock sampling edge of the clock signal CK arrives. A setup requirement "$T_{s\_f}$" (scenario 180) requires that the data signal D to be "high" for a period of time prior to a sampling clock edge and after output Q transitioning from "high" to "low." Similarly, a setup requirement "$T_{s\_r}$" (scenario 190) requires that the data signal D to be "low" for a period of time prior to a sampling clock edge and after output Q transitioning from "low" to "high." The techniques of characterizing "$T_{s\_f}$" and "$T_{s\_r}$" on register 150a will be described as below with respect to FIGS. 4a-4c.

FIG. 3 also illustrates that, in order to satisfy hold requirements, data signal D is required to be valid (i.e., stable) for some period of time after a clock signal CK edge captures it. A hold requirement "$T_{h\_r}$" (scenario 280) requires that the data signal D remain "low" for a period of time after a clock capturing edge and before output Q transitioning from "low" to "high." Similarly, a hold requirement "$T_{h\_f}$" (scenario 290) requires that the data signal D remain "high" for a period of time after a clock capturing edge and before output Q transitioning from "high" to "low." The techniques of characterizing "$T_{h\_r}$" and "$T_{h\_f}$" on register 150b will be described as below with respect to FIGS. 5a-5b.

Figure 4A:
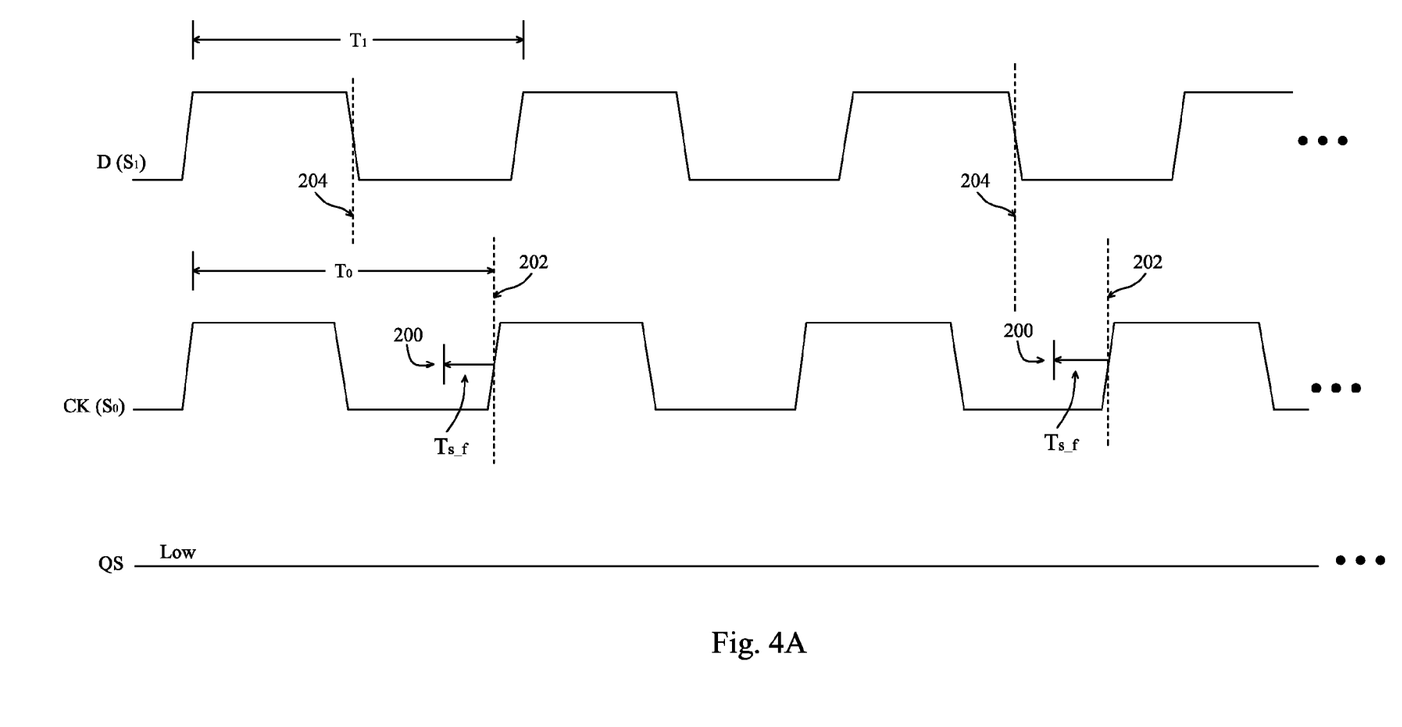
FIGS. 4a-4c illustrate a timing diagram of signals on a register of an illustrative embodiment.
Figure 4B:
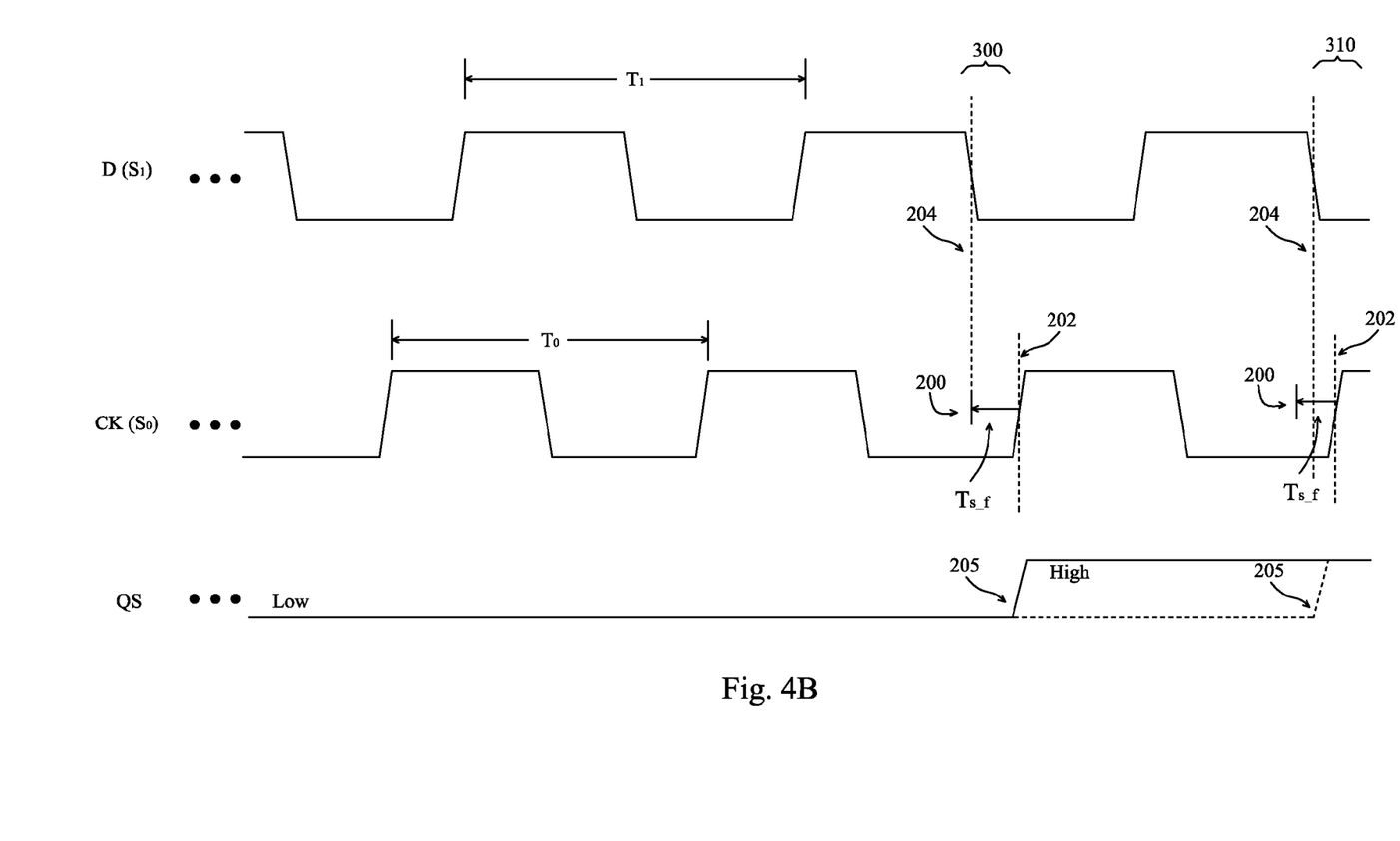
Figure 4C:
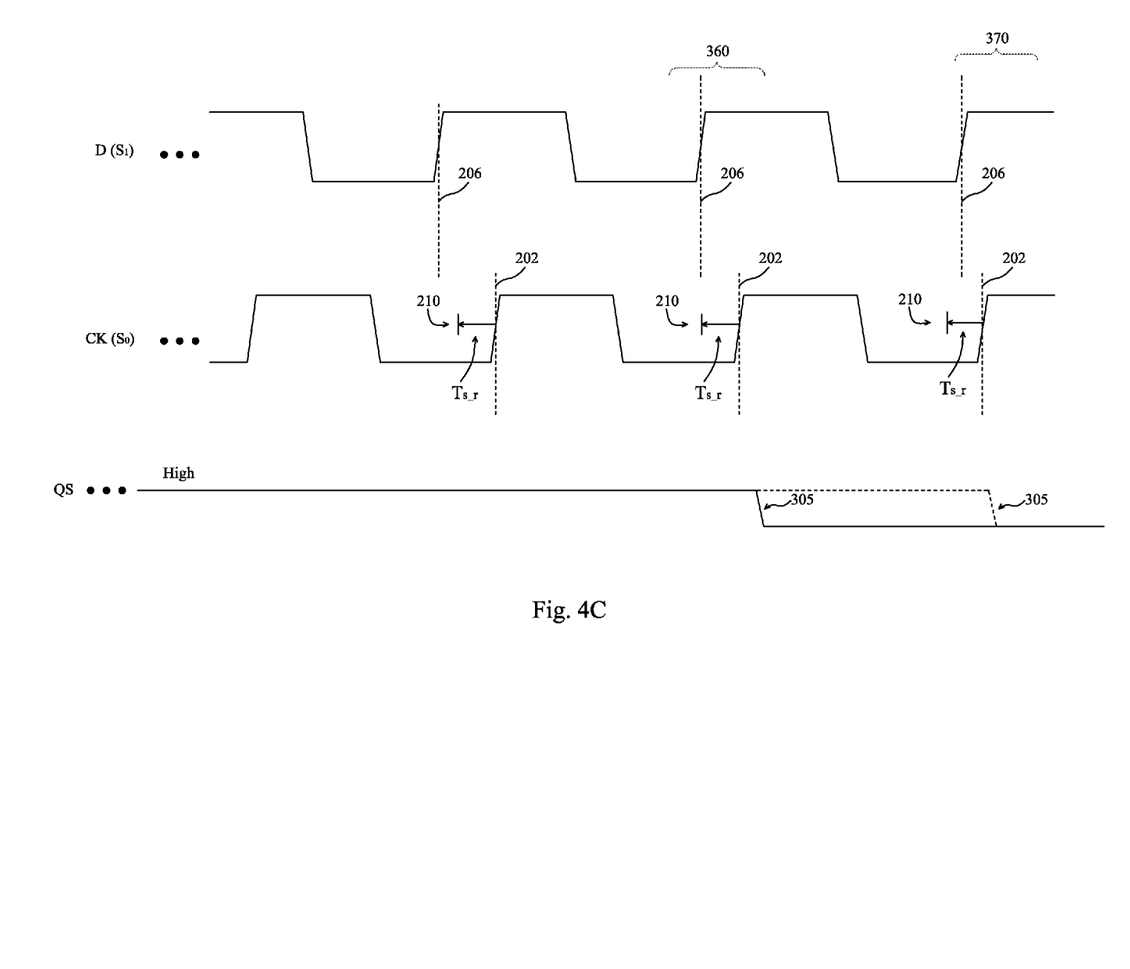

FIGS. 4a-4c are collectively used to illustrate a method for determining the setup time for the register 150a in one preferred embodiment of the present invention. FIG. 4a illustrates the first few periods of the waveforms on the CK pin, D pin, and output pin QS after setup time characterization is started on register 150a. The setup time "$T_{s\_f}$" of register 150a is shown by an arrow extending from the clock sampling edge 202 back toward the time of a data signal transition edge 204, ending with a vertical bar 200 marking the setup requirement. It is shown from FIG. 4a that the setup requirement is satisfied in the shown waveforms, where data signal D remains stable (e.g., low) during the period of the required setup time "$T_{s\_f}$." A data signal transition 204 takes place before the required setup time "$T_{s\_f}$." FIG. 4a reveals that, when the waveforms of clock signal CK and data signal D proceed in time, the time gap between a clock sampling edge 202 and a preceding data signal transition edge 204 narrows gradually due to the mismatched frequency between the data signal D and the clock signal CK. In other words, as time elapses, a clock sampling edge 202 gradually moves toward a preceding data signal transition edge 204. The pace of this trend depends on the frequency difference between signal $S_0$ and $S_1$, the larger the frequency difference, the faster a clock sampling edge approaches a preceding data signal transition edge 204, as can be appreciated.

FIG. 4b illustrates a scenario, where a given setup requirement "$T_{s\_f}$" fails to be satisfied as a clock sampling edge 202 continues to move toward a preceding data signal transition edge 204 as time elapses. At a moment shown at 300, "$T_{s\_f}$" starts to fail when the setup requirement marked as vertical bar 200 coincides with the mid-point of a preceding data signal transition edge 204 that represents a state transition from "high" to "low" in data signal D. This may bring the register 150a under characterization into a meta-stable state, which may cause register 150a to fail to sample the actual state of data signal D at clock sampling edge 202, and may thus result in a state transition 205 in the output signal QS, e.g., from low to high in the current embodiment. It is noted that such failure on register 150a is more of a gradual process, rather than an instantaneous event. As clock sampling edge 202 moves closer to a preceding data signal transition edge 204, such as a scenario at the moment 310, the given setup requirement is more excessively violated, which may further degrade the performance of register 150a. As a result, a state transition 205, shown as a dashed line in the output signal QS, is more likely to occur at moment 310 if it does not occur at moment 300. As time elapses, the degradation of register 150a escalates until register 150a completely fails, which causes a state transition in the output signal QS. It is revealed from an embodiment that a state transition 205 in the output signal QS takes place when a setup violation on register 150a starts to occur (i.e., at moment 300). In another embodiment, state transition 205 (dashed line) in the output signal QS happens at a subsequent clock sampling edge after the occurrence of a setup violation on register 150a (i.e., at moment 310).

Fetch unit 140a (FIG. 2) is utilized to detect the state transition 205 in the output signal QS. Once a state transition 205 is detected, fetch unit 140a stops the counting of digital counter 130a. As a result, the number of the elapsed clock cycles of clock signals $S_0$ prior to the state transition 205 in the output signal QS may be obtained. The setup time "$T_{s\_f}$" of register 150a is the time interval between clock sampling edge 202 and data signal transition edge 204 at moment 300, which is signaled by state transition in the output signal QS. "$T_{s\_f}$" can thus be obtained as the following:

$$T_{s\_f}=N_1\times(T_1-T_0)=N_1\times\Delta T \quad (1)$$

Where $T_0$ is the period of clock signals $S_0$, $T_1$ is the period of data signals $S_1$, $\Delta T=T_1-T_0$, and $N_1$ is the elapsed integer numbers of clock pulses of clock signals $S_0$ after $S_0$ is launched by trigger signal "Start" until a state transition is detected in the output signal QS. In a preferred embodiment, $\Delta T$ is about 2 ps, and a register 150a setup time "$T_{s\_f}$" of about 300 ps is obtained through above technique after about 150 clock signal CK (i.e., $S_0$) cycles.

FIG. 4c illustrates another scenario of the current embodiment, where a given setup requirement "$T_{s\_r}$" fails to be satisfied as a clock sampling edge 202 continues to move toward a preceding "low" to "high" data signal D transition edge 206 as time elapses. At a moment shown at 360, a given setup requirement "$T_{s\_r}$" starts to fail when the setup requirement marked as vertical bar 210 coincides with the mid-point of a preceding data signal transition edge 206 that represents a state transition from "low" to "high" in data signal D. This may bring the register 150a under setup characterization into a meta-stable state in a similar manner as that described above when a violation of setup requirement "$T_{s\_f}$" takes place on register 150a. Consequently, the failure of register 150a may lead to a state transition 305, e.g., from "high" to "low" in the output signal QS. Similar to the mechanism that causes state transition 205 when setup requirement "$T_{s\_f}$" is violated in register 150a, the state transition 305 may take place when a setup violation "$T_{s\_r}$" on register 150a starts to occur (i.e., at moment 360). However, if a state transition 305 does not occur at moment 360, a state transition 305 may more likely occur at a subsequent clock sampling edge (i.e., at moment 370) when the performance of register 150a further degrades.

Fetch unit 140a (FIG. 2) is utilized to detect the state transition 305 in the output signal QS. Digital counter 130a is used to record the number of the elapsed clock cycles of clock signals $S_0$ prior to the state transition 305 in the output signal QS. The setup time "$T_{s\_r}$" of register 150a is the time interval between clock sampling edge 202 and data signal transition edge 206 at moment 360, which is signaled by "high" to "low" state transition in the output signal QS. "$T_{s\_r}$" can be thus obtained as the following:

$$T_{s\_r}=N_2\times(T_1-T_0)=N_2\times\Delta T \quad (2)$$

Where $T_0$ is the period of clock signals $S_0$, $T_1$ is the period of data signals $S_1$, $\Delta T=T_1-T_0$, and $N_2$ is the elapsed integer numbers of clock pulses of clock signals $S_0$ after $S_0$ is launched by trigger signal "Start" until a state transition 305 is detected in the output signal QS. In a preferred embodiment, $\Delta T$ is about 2 ps, and a setup time "$T_{s\_r}$" of about 360 ps is obtained through above technique after about 180 clock signal CK (i.e., $S_0$) cycles.

Figure 5A:
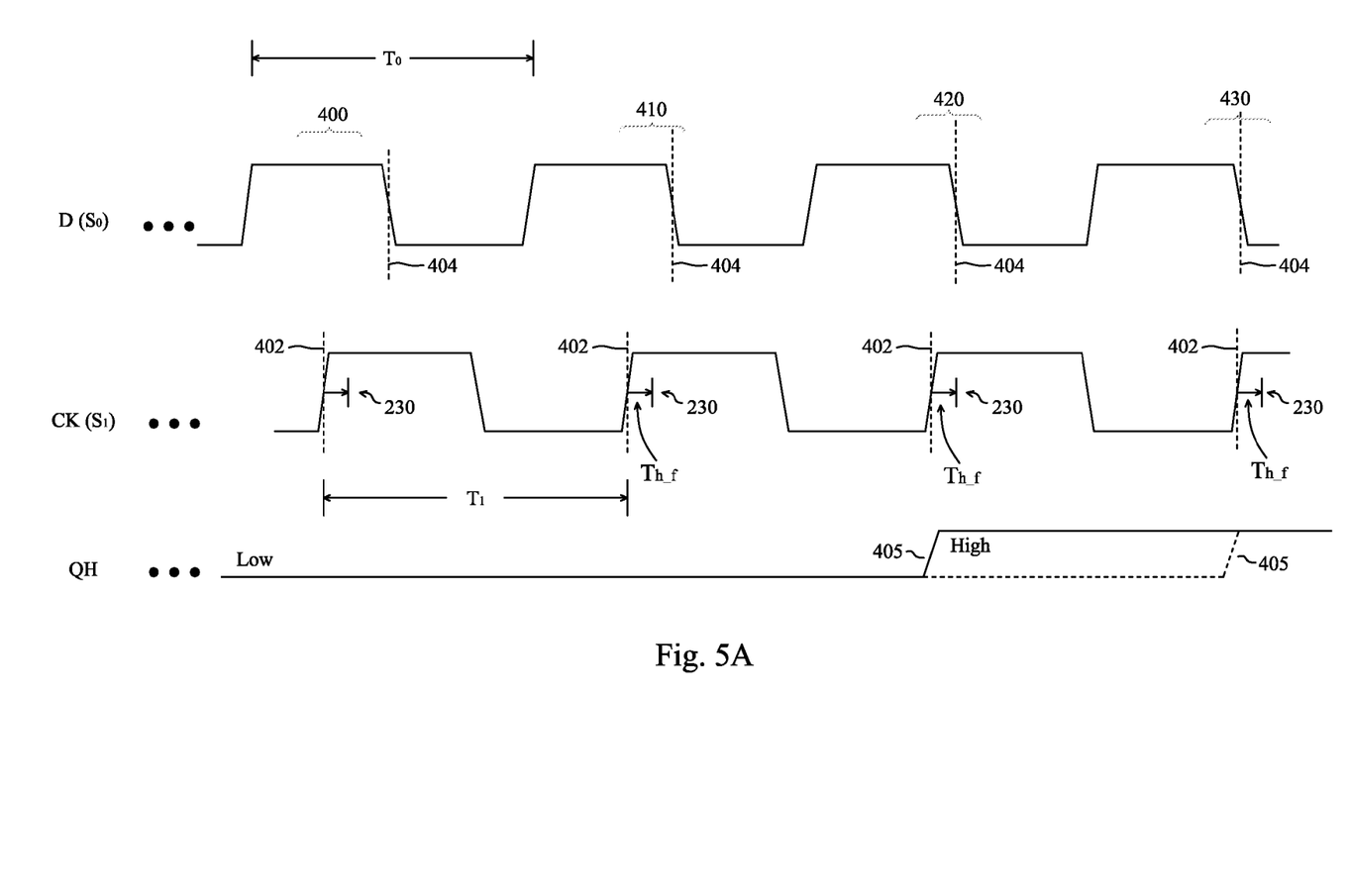
FIGS. 5a-5b illustrate timing diagrams of signals on a register of an illustrative embodiment.
Figure 5B:
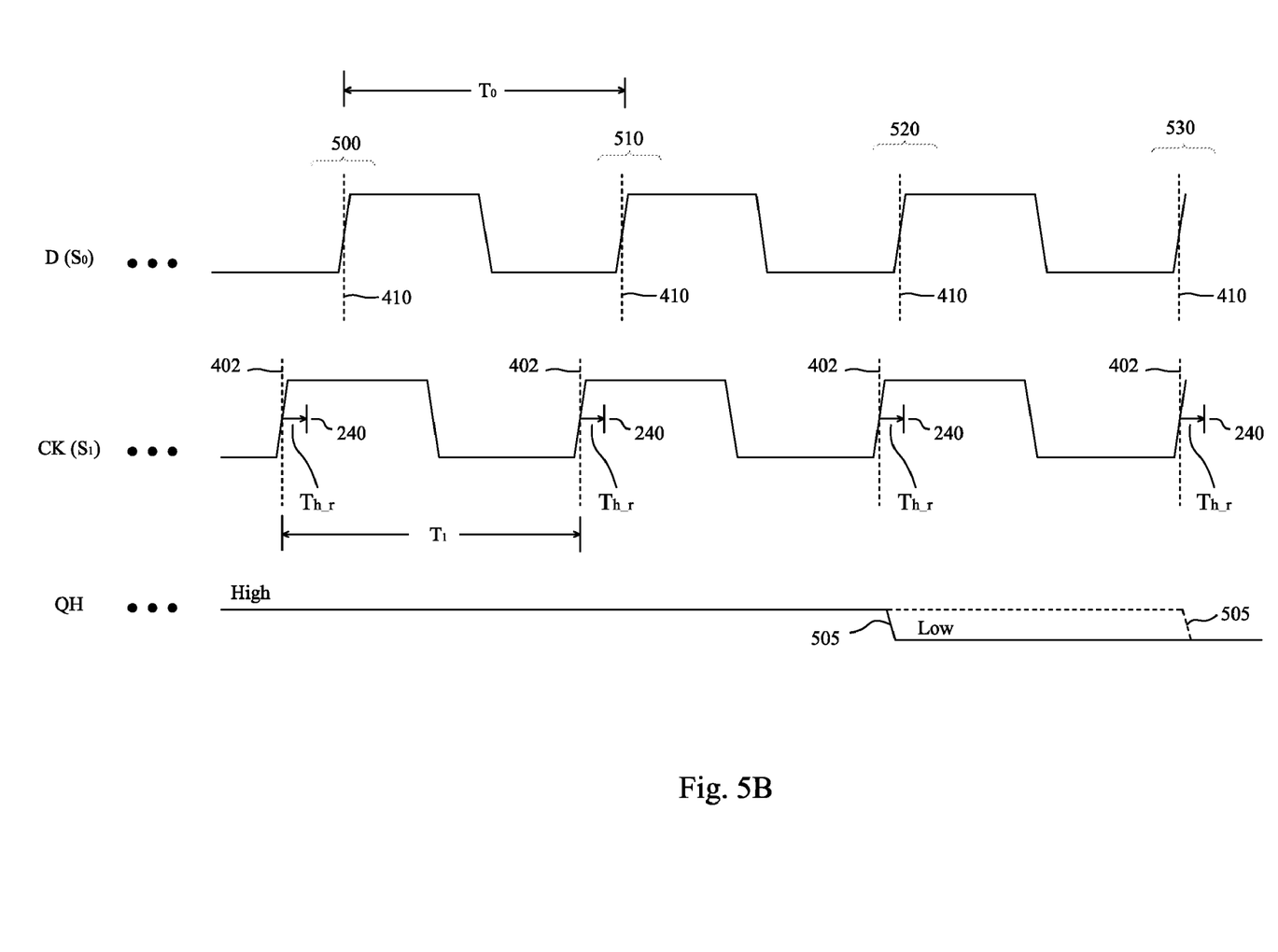

FIGS. 5a-5b are collectively used to illustrate a method for determining the hold time for the register 150b in a preferred embodiment of the present invention. Setup/hold time characterization circuit 100 described above may be used for hold time characterization on replica register 150b. Similar characterization setups may be used. For example, when the trigger signal (FIG. 2) "Start" arrives (e.g., set to state "high"), clock signals $S_0$ and $S_1$ are simultaneously launched from ring oscillators 110a and 110b with synchronized rising edges. The frequency $f_0$ of signal $S_0$ is slightly higher than the frequency $f_1$ of signal $S_1$ (i.e., $T_0$ is less than $T_1$). Signal $S_0$ is coupled to the D pin of registers 150b and is used as input signal of register 150b, while signal $S_1$ is coupled to the CK pin of register 150b and is used as clock signal of register 150b. In an embodiment, register 150b is positive edge-triggered. When the clock signal CK ($S_1$) toggles, the state of data signal D ($S_0$) is sampled into register 150b at each rising edge of the clock signal CK ($S_1$) and is outputted on the output pin QH. The signal on the output pin QH is preset to state "low."

FIG. 5a illustrates a timing diagram where the waveforms on the CK pin, D pin, and output pin QH of register 150b are plotted. In order to satisfy a hold requirement "$T_{h\_f}$", data signal D is required to be valid (i.e., stable) for some period of time after a clock signal ($S_1$) capture edge 402. The hold time "$T_{h\_f}$" of register 150b is shown by an arrow extending from the clock capture edge 402 toward the time of a data signal falling edge 404, ending with a vertical bar 230 marking the hold requirement. It is shown from FIG. 5a that the hold time "$T_{h\_f}$" is satisfied at moment 400, where data signal D remains stable (e.g., high) during the period of the required hold time "$T_{h\_f}$." A data signal transition edge 404 takes place after the required hold time "Th_f." FIG. 5a also shows that, when the waveforms of clock signal CK and data signal D proceed in time, the time gap between a clock capture edge 402 and a succeeding data signal transition edge 404 narrows gradually due to the mismatched frequency between the data signal D ($S_0$) and the clock signal CK ($S_1$). In the characterization setup of FIG. 5a (i.e., $T_0$ is less than $T_1$), a clock capture edge 402 gradually moves toward a succeeding data signal transition edge 404. This trend is clearly illustrated at moment 400 and 410. The pace of this trend depends on the frequency difference between signal $S_0$ and $S_1$, the larger the frequency difference, the faster a clock capture edge approaches a succeeding data signal transition edge 404, as can be appreciated.

At moment 420, hold requirement "$T_{h\_f}$" fails to be satisfied where the hold requirement marked as vertical bar 230 coincides with the mid-point of a succeeding signal falling edge 404 in data signal D. This may bring the register 150b under characterization into a meta-stable state, which may cause register 150b fail to hold the actual state of data signal D captured at clock capture edge 402 and cause a state transition 405 in the output signal QH, e.g., from low to high in the current characterization setup. Moment 430 shows a complete failure on register 150b due to a more excessive hold time "$T_{h\_f}$" violation. Similar to the performance degradation on register 150a due to setup time violation, performance degradation on register 150b due to hold time violation is also a gradual process, which implies that the state transition 405 in the output signal QH will take place at moment 430, if it did not occur at moment 420.

Fetch unit 140b (FIG. 2) is utilized to detect the state transition 405 in the output signal QH. Digital counter 130b is adopted to record the number of the elapsed clock cycles of clock signals $S_1$ prior to the state transition 405 in the output signal QH. The hold time "$T_{h\_f}$" of register 150b is the time interval between clock capture edge 402 and data signal falling edge 404 at moment 420, which can be obtained as the following:

$$T_{h\_f} = N_3 \times (T_1 - T_0) = N_3 \times \Delta T \qquad (3)$$

Where $T_0$ is the period of clock signals $S_0$, $T_1$ is the period of data signals $S_1$, $\Delta T = T_1 - T_0$, and $N_3$ is the elapsed integer numbers of clock pulses of clock signals $S_0$ after $S_0$ is launched by trigger signal "Start" until a state transition 405 is detected in the output signal QH. In an embodiment, $\Delta T$ is about 2 ps, and a setup time "$T_{h\_f}$" of about 250 ps is obtained through the above technique after about 125 clock signal CK (i.e., $S_0$) cycles.

FIG. 5b illustrates another scenario of the current embodiment, where a given hold requirement "$T_{h\_r}$" fails to be satisfied as a clock capture edge 402 gradually approaches a succeeding rising edge 410 of data signal D as time elapses. The hold time "$T_{h\_r}$" of register 150b is shown by an arrow extending from the clock capture edge 402 toward the time of a data signal rising edge 410, ending with a vertical bar 240 marking the hold requirement. It is shown from FIG. 5b that the hold time "$T_{h\_r}$" is satisfied at moment 500, where data signal D remains low during the period of the required hold time "$T_{h\_r}$." A data signal transition 410 from low to high takes place after the required hold time "$T_{h\_r}$." FIG. 5b also shows that, when the waveforms of clock signal CK and data signal D proceed in time, a clock capture edge 402 gradually approaches a succeeding data signal rising edge 410 due to the mismatched frequency between the data signal D ($S_0$) and the clock signal CK ($S_1$). This trend is illustrated at moments 500 through 530. The pace of this trend depends on the frequency difference between signal $S_0$ and $S_1$, the larger the frequency difference, the faster the trend evolves.

At moment 520, hold requirement "$T_{h\_r}$" fails to be satisfied where the hold requirement marked as vertical bar 240 coincides with the mid-point of a succeeding signal rising edge 410 of data signal D. The start of a hold time violation on "$T_{h\_r}$" may bring the register 150b under characterization into a meta-stable state for a similar reason explained above, which may cause register 150b to fail to hold the actual state of data signal D captured at clock capture edge 402 and result in a state transition 505 in the output signal QH, e.g., from high to low in the current characterization setup. Moment 530 shows a complete failure on register 150b due to a more excessive hold time "$T_{h\_r}$" violation. Similar to the performance degradation on register 150a due to hold time violation on "$T_{h\_f}$" performance degradation on register 150b due to hold time violation on "$T_{h\_r}$" worsens gradually until a complete failure on register 150b. That being stated, a state transition 505 in the output signal QH will take place between moment 520 and 530.

Fetch unit 140b (FIG. 2) is utilized to detect the state transition 505 in the output signal QH. Digital counter 130b is adopted to record the number of the elapsed clock cycles of clock signals $S_1$ prior to the state transition 505 in the output signal QH. The hold time "$T_{h\_r}$" of register 150b is the time interval between clock capture edge 402 and data signal rising edge 410 at moment 520, which can be obtained as the following:

$$T_{h\_r} = N_4 \times (T_1 - T_0) = N_4 \times \Delta T \qquad (4)$$

Where $T_0$ is the period of clock signals $S_0$, $T_1$ is the period of data signals $S_1$, $\Delta T = T_1 - T_0$, and $N_4$ is the elapsed integer numbers of clock pulses of clock signals $S_1$ after $S_1$ is launched by trigger signal "Start" until a state transition 505 is detected in the output signal QH. In a preferred embodiment, $\Delta T$ is about 2 ps, and a setup time "$T_{h\_r}$" of about 230 ps is obtained through above technique after about 114 clock signal CK (i.e., $S_1$) cycles.

It should be noted that wave forms of the signals CK, D and QH in FIGS. 4a-4c and FIGS. 5a-5b are used to demonstrate the trend of how setup and hold time violation is gradually developed. As an example, in FIG. 5a, wave forms at moments 400 through 430 are shown in a consecutive manner, which illustrates the process of the occurrence of hold violation "$T_{h\_f}$." In reality, however, this process takes place gradually, and may take a large number of clock cycles for the wave forms at moment 400 to evolve into the wave forms at moment 420, for example, rather than taking only two clock cycles as shown in FIG. 5a.

In the above descriptions with respect to characterizing the setup/hold times on a sequential cell, a characterization condition is used where the frequency $f_0$ of signal $S_0$ is slightly larger than the frequency $f_1$ of signal $S_1$ (i.e., $T_0$ is less than $T_1$ by a very small amount). It should be noted that this characterization condition is used only for the purpose of consistency in describing and comparing the various setup/hold time scenarios. Such a condition is not required in practicing the preferred embodiments so long as a setup/hold violation which occurred in a sequential cell triggers a state transition in an output signal, and the state transition thus created can be detected and the elapsed clock cycles can be counted by certain circuit means. However, as can be appreciated from the above description, in order to obtain a high characterization precision, a large number of elapsed clock cycles are typically desirable before a setup/hold-violation-triggered state transition takes place in the output signals of DUTs, such as QS and QH of registers 150a and 150b. Consequently, it requires that the frequency $f_1$ of signal $S_1$ is very close to the frequency $f_0$ of signal $S_0$ (i.e., $T_0$ and $T_1$ differs by a very small amount). For instance, $\Delta T$ ($\Delta T = |T_1 - T_0|$) is less than 5 ps for signals $S_0$ and $S_1$ in preferred embodiments.

Figure 6A:
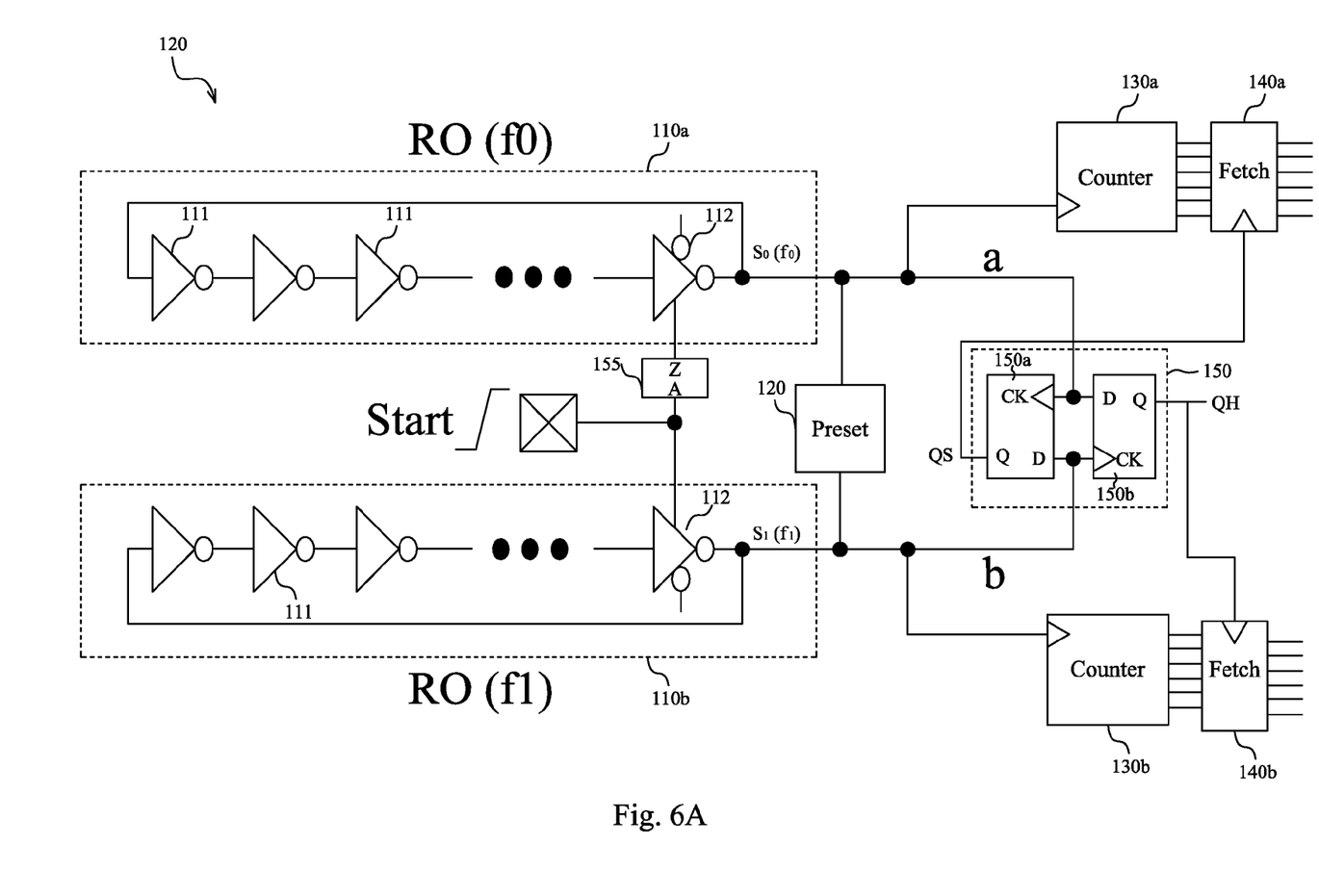
FIG. 6a illustrates a block diagram of logic cell propagation delay characterization circuit of an illustrative embodiment.

FIG. 6a illustrates that characterization circuit 100 described above may be used to characterize the propagation delay on a logic cell 155 (also interchangeably referred to as DUT 155). An input pin of DUT 155, such as input pin A, is coupled to the trigger signal "Start," while the output pin of DUT 155, such as output pin Z, is coupled to the first ring oscillator 110a. DUT 155 may be a combinational cell, such as a buffer, an inverter, a NAND or NOR gate, a multiplexer (MUX), and an adder. In an embodiment shown in FIG. 6a, DUT 155 is coupled between ring oscillator 110a and the trigger signal "Start."

Figure 6B:
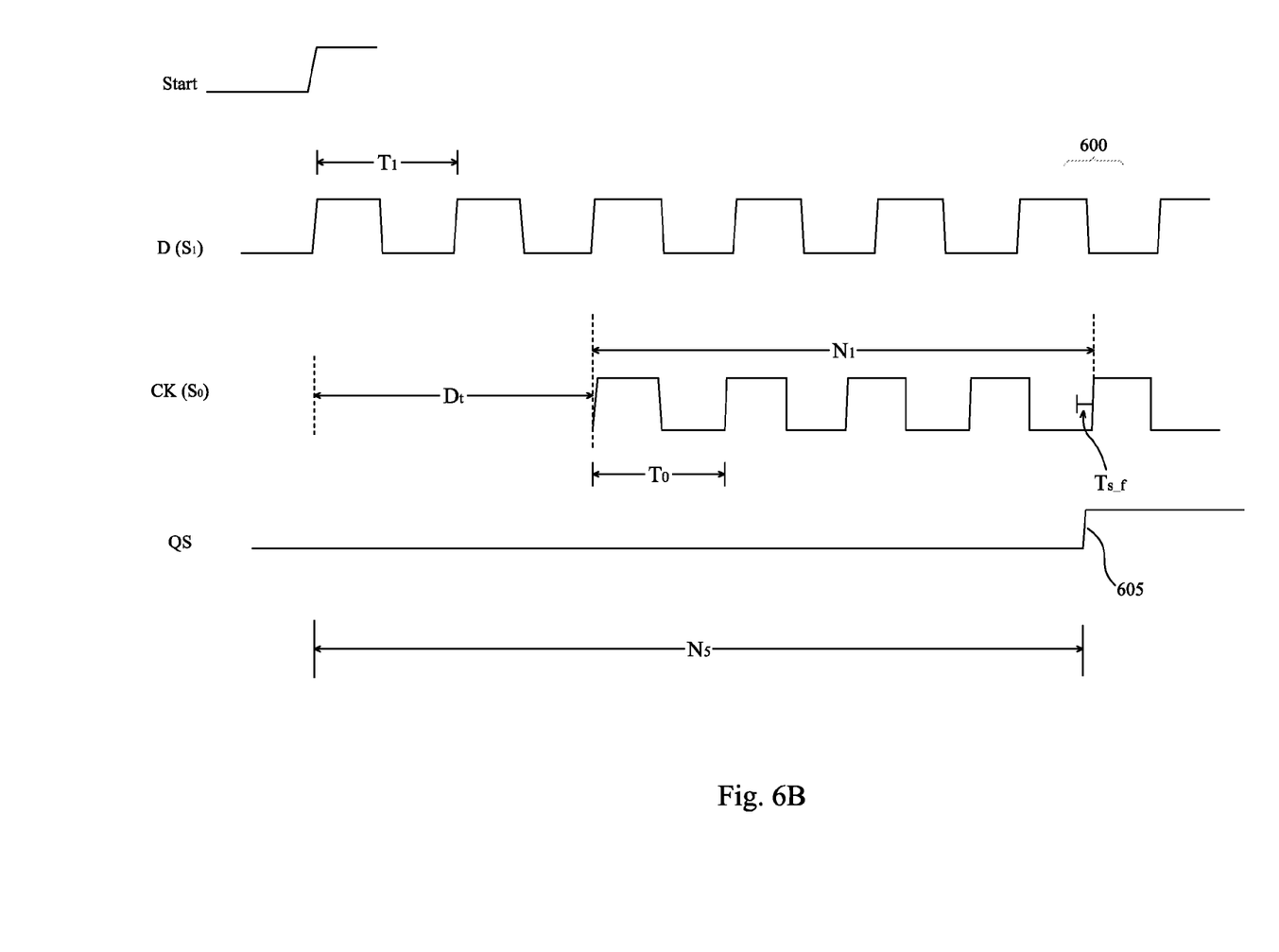
FIG. 6b illustrates a timing diagram of signals on a register of an illustrative embodiment.

FIG. 6b is a timing diagram illustrating the waveforms on the CK pin, D pin, and output pin QS of register 150a with DUT 155 coupled in characterization circuit 100 for propagation delay characterization. In the current embodiment, a characterization setup similar to that described with respect to FIG. 2 is used for measuring propagation delay on logic cell 155. When the trigger signal "Start" is launched (e.g., set to state "high"), clock signals $S_0$ and $S_1$ are launched from ring oscillators 110a and 110b with offset rising edges, due to the propagation delay on DUT 155. In an example, the frequency $f_0$ of clock signal $S_0$ is slightly larger than the frequency $f_1$ of clock signal $S_1$ (i.e., $T_0$ is less than $T_1$). A time delay Dt is introduced into clock signal $S_0$ after the trigger signal "Start" passes through DUT 155, as shown. The clock signal $S_0$ is subsequently coupled to the CK pin of registers 150a and is used as a clock signal of register 150a, while signal $S_1$ is coupled to the D pin of register 150a and is used as an input signal of register 150a. When the clock signal CK ($S_0$) toggles, the state of data signal D ($S_1$) is sampled into register 150a at each rising edge of the clock signal CK ($S_0$) and is outputted on the output pin QS. As time elapses, a clock sampling edge of clock signal $S_0$ continues to move toward a preceding data signal $S_1$ transition edge. At a moment shown at 600, a setup violation, such as a "$T_{s\_f}$" violation, on register 150a may cause register 150a fail to operate and cause a state transition 605, e.g., from low to high, in the output signal QS of register 150a in a similar mechanism as described above.

Fetch unit 140a (FIG. 2) may be used to detect the state transition 605 in the output signal QS. Digital counter 130a may be adopted to record the number of the elapsed clock cycles N1 of clock signals $S_0$ prior to the state transition 605 in the output signal QS. Digital counter 130b may be adopted to record the number of the elapsed clock cycles N5 of clock signals $S_1$ prior to the state transition 605 in the output signal QS. The propagation delay Dt on DUT 155 may be thus obtained as the following:

$$Dt=(N5-N1)\times \Delta T \quad (5)$$

Where $\Delta T=T_1-T_0$, $T_0$ is the period of clock signals $S_0$, and $T_1$ is the period of data signals $S_1$.

In cases where the propagation delay on DUT 155 is characterized for falling transitions, the output stage of ring oscillators 110a and 110b typically comprises a "low-enabled" tri-state buffer, which launches clock signals $S_0$ and $S_1$ on a high-to-low transition of trigger signal "Start". Additional control signals may be implemented that facilitate configuring the trigger signal "Start" and the output stages of ring oscillators 110a and 110b into a "high-enabled" configuration or a "low-enabled" configuration.

Although the present invention and its advantages have been described in detail, it should be understood that various changes, substitutions and alterations can be made herein without departing from the spirit and scope of the invention as defined by the appended claims As an example, the inventive feature involving sequential cell setup/hold characterization and logic cell propagation delay characterization in the preferred embodiments may be implemented with other suitable circuit configurations. As another example, it will be readily understood by those skilled in the art that materials, process steps, and process parameters in forming the preferred embodiments may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for setup and hold characterization in an integrated circuit cell, the method comprising:
    generating a first and a second periodic signal, the first periodic signal having a frequency greater than the frequency of the second periodic signal;
    coupling the first periodic signal to a clock pin of a first sequential cell and coupling the second periodic signal to a data input pin of the first sequential cell, thereby causing the second periodic signal to be sampled at a transition of the first periodic signal;
    coupling the first periodic signal to a data input pin of a second sequential cell and coupling the second periodic signal to a clock pin of the second sequential cell, thereby causing the first periodic signal to be sampled at a transition of the second periodic signal, the second sequential cell being substantially identical with the first sequential cell;
    determining a first setup time from a first state transition in an output signal of the first sequential cell; and
    determining a first hold time from a first state transition in an output signal of the second sequential cell.

2. The method of claim 1, wherein generating the first periodic signal is performed at least in part by a first ring oscillator, and wherein generating the second periodic signal is performed at least in part by a second ring oscillator, and wherein the first and the second ring oscillator are substantially identical.

3. The method of claim 1, wherein generating the first periodic signal and generating the second periodic signal are substantially synchronized by a trigger signal.

4. The method of claim 1, wherein determining the first setup time further comprises:
    detecting a first state transition in the output signal of the first sequential cell; and
    fetching a number of elapsed cycles of the first period signal after detecting the first state transition in the first sequential cell,
    wherein detecting and fetching are performed at least in part by a first fetch unit, the first fetch unit being coupled to a first counter and the output signal of the first sequential cell.

5. The method of claim 1, wherein determining the first hold time further comprises:
    detecting a first state transition in the output signal of the second sequential cell; and
    fetching a number of elapsed cycles of the second period signal prior to the first state transition in the second sequential cell, wherein detecting and fetching are performed at least in part by a second fetch unit, the second fetch unit being coupled to a second counter and the output signal of the second sequential cell.

6. The method of claim 1, wherein the first and the second sequential cell may be selected from a group consisting of a flip-flop, a latch, and a memory.

7. The method of claim 1, further comprising:
    determining a second setup time by detecting a second state transition in an output signal of the first sequential cell; and
    determining a second hold time by detecting a second state transition in an output signal of the second sequential cell.

8. A method for integrated circuit cell characterization, the method comprising:
- providing a first and a second sequential cells with cross-connected inputs, the first and the second sequential cells being substantially identical, wherein a clock input of the first sequential cell is coupled to the data input of the second sequential cell, thereby forming a first node, and wherein a clock input of the second sequential cell is coupled to the data input of the first sequential cell, thereby forming a second node;
- providing a first periodic signal to the first node and providing a second periodic signal to the second node, the first and the second periodic signal being launched by a trigger signal;
- detecting a first state transition in an output signal of the first sequential cell;
- fetching a first number of elapsed cycles of the first periodic signal until the first state transition in the first sequential cell;
- detecting a second state transition in an output signal of the second sequential cell; and
- fetching a second number of elapsed cycles of the second periodic signal until the second state transition in the second sequential cell.

9. The method of claim 8, further comprising:
- determining a first setup time of the first sequential cell from the first number of elapsed cycles of the first periodic signal; and
- determining a first hold time of the second sequential cell from the second number of elapsed cycles of the second periodic signal.

10. The method of claim 8, wherein the first and the second sequential cell may be selected from a group consisting of a flip-flop, a latch, and a memory.

11. The method of claim 8, wherein detecting the first state transition is performed at least in part by a first fetch unit, and wherein fetching the first number is performed at least in part by a first counter.

12. The method of claim 8, wherein the first periodic signal is generated from a first clock source and the second periodic signal is generated from a second clock source, and wherein the first periodic signal has a frequency greater than the frequency of the second periodic signal.

13. The method of claim 12, wherein the first and the second clock sources are ring oscillators with substantially identical configuration.

14. The method of claim 12 further comprising:
- coupling a device-under-test (DUT) between the first clock source and the trigger signal;
- detecting a third state transition in an output signal of the first sequential cell;
- fetching a third number of elapsed cycles of the first periodic signal until the third state transition in the first sequential cell; and
- determining a propagation delay of the DUT from the third number of the elapsed cycles of the first periodic signal.

15. The method of claim 14, wherein the DUT may be selected from a group consisting of a buffer, an inverter, a NAND gate, a NOR gate, a multiplexer (MUX), an adder, a flip-flop, a latch, and a memory cell.

16. An integrated circuit cell timing characterization circuit comprising:
- a first sequential cell coupled to a first clock signal and a second clock signal, the first clock signal being a clock for the first sequential cell and the second clock signal being an input data for the first sequential cell;
- a second sequential cell coupled to the first clock signal and the second clock signal, the second clock signal being a clock for the second sequential cell and the first clock signal being an input data for the second sequential cell;
- a first counter coupled to the first clock signal;
- a first fetch unit coupled to the first counter and to an output of the first sequential cell;
- a second counter coupled to the second clock signal; and
- a second fetch unit coupled to the second counter and to an output of the second sequential cell.

17. The integrated circuit cell timing characterization circuit of claim 16, further comprising:
- a trigger circuit coupled between the first and the second clock signal, thereby simultaneously launching the first and the second clock signal.

18. The integrated circuit cell timing characterization circuit of claim 16, further comprising a preset circuit coupled between the first and the second clock signal, thereby adjusting the phase between the first and the second clock signal.

19. The integrated circuit cell timing characterization circuit of claim 16, further comprising:
- a device-under-test (DUT) between the first clock signal and the trigger circuit, wherein a propagation delay of the DUT is determined by detecting a state transition in an output signal of the first sequential cell.

20. The integrated circuit cell timing characterization circuit of claim 16, wherein the first and the second sequential cells are substantially identical, and may be selected from a group consisting of a flip-flop, a latch, and a memory.

* * * * *